United States Patent
Troester et al.

(10) Patent No.: US 10,131,113 B2
(45) Date of Patent: Nov. 20, 2018

(54) MULTILAYERED CARBON-CARBON COMPOSITE

(71) Applicant: Honeywell International Inc., Morristown, NJ (US)

(72) Inventors: Jeffrey Troester, Granger, IN (US); Slawomir T. Fryska, Granger, IN (US); David Flask, Granger, IN (US)

(73) Assignee: Honeywell International Inc., Morris Plains, NJ (US)

( * ) Notice: Subject to any disclaimer, the term of this patent is extended or adjusted under 35 U.S.C. 154(b) by 281 days.

(21) Appl. No.: 14/711,590

(22) Filed: May 13, 2015

(65) Prior Publication Data

US 2016/0332416 A1 Nov. 17, 2016

(51) Int. Cl.
    *C23C 16/26* (2006.01)
    *B32B 5/02* (2006.01)
    (Continued)

(52) U.S. Cl.
    CPC ............... *B32B 5/02* (2013.01); *B29C 64/00* (2017.08); *B32B 9/00* (2013.01); *B32B 9/04* (2013.01);
    (Continued)

(58) Field of Classification Search
    CPC .................................................... C23C 16/26
    See application file for complete search history.

(56) References Cited

U.S. PATENT DOCUMENTS 3,028,284 A 4/1962 Reeves
3,596,314 A 8/1971 Krugler
(Continued)

FOREIGN PATENT DOCUMENTS

CN 101511569 A 8/2009
CN 103939509 A 7/2014
(Continued)

OTHER PUBLICATIONS

Response to Extended Search Report dated Oct. 7, 2017, from counterpart European Application No. 16167370, filed May 12, 2017, 9 pp.
Extended Search Report from counterpart European Application No. 16167370.2-1371, dated Oct. 7, 2016, 8 pp.
Senese, "MarkForged Lets you 3D Print with Carbon Fiber and Kevlar on a Budget," Makezine, retrieved from URL: http://makezine.com/2015/01/15/3d-printed-carbon-fiber-markforged and accessed Nov. 11, 2016, Jan. 15, 2015, 6 pp.
(Continued)

*Primary Examiner* — David P Turocy
(74) *Attorney, Agent, or Firm* — Shumaker & Sieffert, P.A.

(57) ABSTRACT

In some examples, the disclosure describes a method including densifying a layer of carbon fibers by at least one of depositing a resin on the layer of carbon fibers via a print head of a three-dimensional printing system or applying CVD on the layer of carbon fibers via the print head; and forming at least one additional layer of densified carbon fibers on the densified layer of carbon fibers, wherein forming the at least one additional layer of densified carbon fibers comprises, for each respective layer of the at least one additional layer, adding an additional layer of carbon fibers on the densified layer of carbon fibers, and densifying the additional layer of carbon fibers by at least one of depositing the resin on the additional layer of carbon fibers or applying CVD on the additional layer of carbon fibers. In some examples, the example method may be used to form a densified carbon-carbon composite component, such as, e.g., a densified carbon-carbon composite brake disc.

16 Claims, 6 Drawing Sheets

(51) Int. Cl.
| | | |
|---|---|---|
| *F16D 69/02* | (2006.01) | |
| *B33Y 10/00* | (2015.01) | |
| *B33Y 80/00* | (2015.01) | |
| *B33Y 30/00* | (2015.01) | |
| *B32B 18/00* | (2006.01) | |
| *B32B 37/02* | (2006.01) | |
| *C04B 35/83* | (2006.01) | |
| *F16D 65/12* | (2006.01) | |
| *B32B 9/00* | (2006.01) | |
| *B32B 9/04* | (2006.01) | |
| *B29C 64/00* | (2017.01) | |
| *C23C 16/04* | (2006.01) | |
| *C23C 16/52* | (2006.01) | |
| *B33Y 50/02* | (2015.01) | |
| *C04B 111/00* | (2006.01) | |
| *F16D 121/04* | (2012.01) | |

(52) U.S. Cl.
CPC .............. *B32B 18/00* (2013.01); *B32B 37/02* (2013.01); *B33Y 10/00* (2014.12); *B33Y 30/00* (2014.12); *B33Y 80/00* (2014.12); *C04B 35/83* (2013.01); *C23C 16/045* (2013.01); *C23C 16/26* (2013.01); *C23C 16/52* (2013.01); *F16D 65/12* (2013.01); *F16D 65/126* (2013.01); *F16D 69/023* (2013.01); *B32B 2250/05* (2013.01); *B32B 2250/20* (2013.01); *B32B 2260/046* (2013.01); *B32B 2262/00* (2013.01); *B32B 2262/106* (2013.01); *B32B 2307/554* (2013.01); *B32B 2307/56* (2013.01); *B32B 2307/72* (2013.01); *B32B 2307/75* (2013.01); *B32B 2475/00* (2013.01); *B32B 2605/18* (2013.01); *B33Y 50/02* (2014.12); *C04B 2111/00362* (2013.01); *C04B 2235/48* (2013.01); *C04B 2235/5248* (2013.01); *C04B 2235/6026* (2013.01); *C04B 2235/614* (2013.01); *C04B 2235/616* (2013.01); *F16D 2121/04* (2013.01); *F16D 2200/0047* (2013.01); *F16D 2200/0091* (2013.01)

(56) References Cited

U.S. PATENT DOCUMENTS

| | | |
|---|---|---|
| 3,703,255 A | 11/1972 | Wade |
| 3,975,128 A | 8/1976 | Schluter |
| 3,982,877 A | 9/1976 | Wyeth et al. |
| 4,264,556 A | 4/1981 | Kumar et al. |
| 4,428,906 A | 1/1984 | Rozmus |
| 4,756,680 A | 7/1988 | Ishii |
| 4,837,073 A | 6/1989 | McAllister et al. |
| 4,957,585 A | 9/1990 | Semff |
| 5,009,823 A | 4/1991 | Kromrey |
| 5,137,663 A | 8/1992 | Conaway |
| 5,137,755 A | 8/1992 | Fujikawa et al. |
| 5,147,588 A | 9/1992 | Okura et al. |
| 5,178,705 A | 1/1993 | Kimbara et al. |
| 5,187,001 A | 2/1993 | Brew |
| 5,242,746 A | 9/1993 | Bommier et al. |
| 5,283,109 A | 2/1994 | Kaplan et al. |
| 5,306,448 A | 4/1994 | Kromrey |
| 5,382,392 A | 1/1995 | Prevorsek et al. |
| 5,516,271 A | 5/1996 | Swenor et al. |
| 5,518,385 A | 5/1996 | Graff |
| 5,576,358 A | 11/1996 | Lem et al. |
| 5,686,144 A | 11/1997 | Thebault et al. |
| 5,728,345 A * | 3/1998 | Hlavaty ............... B29C 33/448 264/105 |
| 5,759,622 A | 6/1998 | Stover |
| 5,962,135 A | 10/1999 | Walker et al. |
| 6,054,082 A | 4/2000 | Heide et al. |
| 6,093,482 A * | 7/2000 | Park ........................ C04B 35/83 264/29.6 |
| 6,110,268 A | 8/2000 | Gross et al. |
| 6,214,279 B1 | 4/2001 | Yang et al. |
| 6,221,475 B1 | 4/2001 | Domergue et al. |
| 6,245,424 B1 | 6/2001 | Lau et al. |
| 6,261,486 B1 | 7/2001 | Sulzbach et al. |
| 6,267,920 B1 | 7/2001 | Arakawa et al. |
| 6,305,925 B1 | 10/2001 | Cassani |
| 6,325,608 B1 | 12/2001 | Shivakumar et al. |
| 6,358,565 B1 | 3/2002 | Krenkel et al. |
| 6,372,166 B1 | 4/2002 | Cassani |
| 6,455,159 B1 | 9/2002 | Walker et al. |
| 6,471,800 B2 * | 10/2002 | Jang ..................... B29C 64/165 156/155 |
| 6,508,970 B2 | 1/2003 | Chandra |
| 6,521,152 B1 | 2/2003 | Wood et al. |
| 6,537,470 B1 | 3/2003 | Wood et al. |
| 6,555,173 B1 | 4/2003 | Forsythe et al. |
| 6,578,474 B1 | 6/2003 | Sasaki |
| 6,726,753 B2 | 4/2004 | Kouchouthakis et al. |
| 6,749,937 B2 | 6/2004 | Gray |
| 6,756,121 B2 | 6/2004 | Forsythe et al. |
| 6,884,467 B2 | 4/2005 | Walker et al. |
| 6,886,668 B2 | 5/2005 | Kouchouthakis et al. |
| 6,896,968 B2 | 5/2005 | Golecki |
| 6,939,490 B2 | 9/2005 | La Forest et al. |
| 7,025,913 B2 | 4/2006 | La Forest et al. |
| 7,052,632 B2 * | 5/2006 | Lavasserie ............ B29C 70/025 156/89.25 |
| 7,063,870 B2 | 6/2006 | La Forest et al. |
| 7,118,805 B2 | 10/2006 | Walker et al. |
| 7,141,207 B2 | 11/2006 | Jandeska, Jr. et al. |
| 7,172,408 B2 | 2/2007 | Wood et al. |
| 7,198,739 B2 | 4/2007 | La Forest et al. |
| 7,252,499 B2 | 8/2007 | La Forest et al. |
| 7,258,896 B2 * | 8/2007 | Deckard ................. B29C 70/00 156/272.8 |
| 7,318,717 B2 | 1/2008 | Wood et al. |
| 7,332,112 B1 | 2/2008 | Shivakumar et al. |
| 7,332,195 B2 | 2/2008 | Arico et al. |
| 7,370,738 B2 | 5/2008 | Vollweiter |
| 7,393,370 B2 | 7/2008 | Peterman, Jr. et al. |
| 7,423,072 B2 | 9/2008 | Lee et al. |
| 7,442,024 B2 | 10/2008 | La Forest et al. |
| 7,556,490 B2 | 7/2009 | Wicker et al. |
| 7,589,868 B2 | 9/2009 | Velde et al. |
| 7,632,435 B2 | 12/2009 | Simpson et al. |
| 7,681,627 B2 | 3/2010 | Schmitz et al. |
| 7,698,817 B2 | 4/2010 | Khambete et al. |
| 7,700,014 B2 | 4/2010 | Simpson et al. |
| 7,727,448 B2 | 6/2010 | Boutefeu et al. |
| 7,867,566 B2 | 1/2011 | Blanton et al. |
| 7,972,129 B2 | 7/2011 | O'Donoghue |
| 8,002,919 B2 | 8/2011 | Johnson et al. |
| 8,492,466 B2 | 7/2013 | Abe et al. |
| 8,501,033 B2 | 8/2013 | Southwell et al. |
| 8,592,519 B2 | 11/2013 | Martinoni |
| 8,597,772 B2 | 12/2013 | La Forest et al. |
| 8,742,014 B2 | 6/2014 | Hongo |
| 2001/0019798 A1 | 9/2001 | Kajiura et al. |
| 2001/0030094 A1 | 10/2001 | Pareti |
| 2002/0022570 A1 | 2/2002 | Reynolds, III |
| 2002/0047227 A1 | 4/2002 | Matsumoto |
| 2003/0003286 A1 | 1/2003 | Gruber et al. |
| 2003/0021901 A1 | 1/2003 | Gasse |
| 2003/0030188 A1 | 2/2003 | Spengler |
| 2003/0111752 A1 | 6/2003 | Wood et al. |
| 2003/0143436 A1 | 7/2003 | Forsythe et al. |
| 2003/0214064 A1 | 11/2003 | Shin et al. |
| 2004/0020728 A1 | 2/2004 | Koucouthakis et al. |
| 2004/0113302 A1 | 6/2004 | La Forest et al. |
| 2004/0168612 A1 | 9/2004 | Saver |
| 2004/0202896 A1 | 10/2004 | Gray |
| 2004/0219510 A1 | 11/2004 | Lowery et al. |
| 2006/0046059 A1 | 3/2006 | Arico et al. |
| 2006/0069176 A1 | 3/2006 | Bowman et al. |
| 2006/0127599 A1 * | 6/2006 | Wojak ..................... C23C 16/01 427/569 |

(56) References Cited

U.S. PATENT DOCUMENTS

| | | |
|---|---|---|
| 2006/0197244 A1 | 9/2006 | Simpson et al. |
| 2006/0232392 A1 | 10/2006 | Emmett et al. |
| 2006/0267252 A1 | 11/2006 | Steinmann et al. |
| 2006/0279012 A1 | 12/2006 | Simpson et al. |
| 2007/0063378 A1 | 3/2007 | O'Donoghue |
| 2007/0132126 A1 | 6/2007 | Shao et al. |
| 2007/0154712 A1 | 7/2007 | Mazany et al. |
| 2007/0218208 A1 | 9/2007 | Walker et al. |
| 2008/0318010 A1 | 12/2008 | Wozniak et al. |
| 2009/0145314 A1 | 6/2009 | Botrie |
| 2009/0169825 A1* | 7/2009 | Farmer ............... B29C 70/14 428/167 |
| 2009/0176034 A1 | 7/2009 | Ruuttu et al. |
| 2009/0229926 A1 | 9/2009 | Schaefer |
| 2009/0298962 A1 | 12/2009 | Studer et al. |
| 2009/0321979 A1* | 12/2009 | Hiraide ............... B33Y 10/00 264/113 |
| 2010/0000070 A1 | 1/2010 | La Forest et al. |
| 2011/0030940 A1 | 2/2011 | Takeda |
| 2012/0082559 A1 | 4/2012 | Guglielmin et al. |
| 2012/0104659 A1 | 5/2012 | La Forest et al. |
| 2012/0251829 A1 | 10/2012 | Xu et al. |
| 2012/0304449 A1 | 12/2012 | Jackson et al. |
| 2013/0157826 A1 | 6/2013 | Preckel et al. |
| 2013/0174969 A1 | 7/2013 | Karb et al. |
| 2013/0237636 A1 | 9/2013 | Strauss |
| 2013/0244039 A1 | 9/2013 | Peters et al. |
| 2013/0248304 A1 | 9/2013 | Lee et al. |
| 2013/0284548 A1 | 10/2013 | Guether et al. |
| 2014/0134335 A1 | 5/2014 | Pridoehl et al. |
| 2014/0194328 A1 | 7/2014 | Alessi |
| 2014/0298728 A1 | 10/2014 | Keshavan |
| 2014/0356612 A1 | 12/2014 | Sano et al. |
| 2014/0361460 A1 | 12/2014 | Mark |
| 2015/0018136 A1 | 1/2015 | Goldstein et al. |
| 2015/0093506 A1 | 4/2015 | Bucci et al. |
| 2015/0321187 A1 | 11/2015 | Dias et al. |
| 2016/0046803 A1 | 2/2016 | Boday et al. |
| 2016/0082695 A1* | 3/2016 | Swartz ............... B29C 70/42 428/172 |
| 2016/0151982 A1* | 6/2016 | Sand ............... B33Y 70/00 428/201 |
| 2016/0346997 A1 | 12/2016 | Lewis et al. |

FOREIGN PATENT DOCUMENTS

| | | |
|---|---|---|
| CN | 104451606 A | 3/2015 |
| CN | 104496508 A | 4/2015 |
| DE | 102007057450 A1 | 6/2009 |
| DE | 102014006432 A1 | 11/2015 |
| EP | 1165191 A1 | 1/2002 |
| EP | 1724245 A1 | 11/2006 |
| EP | 1731292 A2 | 12/2006 |
| EP | 2295227 A2 | 3/2011 |
| EP | 2450170 A2 | 9/2012 |
| EP | 3095593 A1 | 11/2016 |
| GB | 2386951 | 1/2003 |
| GB | 2470098 | 11/2010 |
| JP | 2013088196 | 5/2013 |
| JP | 5352893 B2 | 11/2013 |
| WO | 9908980 A1 | 2/1999 |
| WO | 0054852 A1 | 9/2000 |
| WO | 2004050319 A1 | 6/2004 |
| WO | 2004052629 A1 | 6/2004 |
| WO | 2004106766 | 12/2004 |
| WO | 2006033373 A1 | 3/2006 |
| WO | 2006086167 A1 | 8/2006 |
| WO | 2013126981 A1 | 9/2013 |
| WO | 2014035382 A1 | 3/2014 |
| WO | 2014060430 A1 | 4/2014 |
| WO | 2014134224 A2 | 9/2014 |
| WO | 2014153535 A2 | 9/2014 |
| WO | WO-2014134224 A2 * | 9/2014 ............ B33Y 10/00 |
| WO | 2014174540 A1 | 10/2014 |
| WO | 2014175625 A1 | 10/2014 |
| WO | 2015006697 A1 | 1/2015 |
| WO | 2015038260 A2 | 3/2015 |
| WO | 2015053658 A1 | 4/2015 |

OTHER PUBLICATIONS

Response to Office Action dated Aug. 30, 2017, from U.S. Appl. No. 14/854,993, filed Nov. 15, 2017, 11 pp.

A. Fatz, et al., "Manufacture of Functionally Gradient Carbon-Carbon Composites," Proceedings of the 17th Technical Conference of the American Society of Composites, Oct. 21-23, 2002, Purdue University, West Lafayette, Ind., 9 pp.

Tekinalp et al., "Highly oriented carbon fiber-polymer composites via additive manufacturing," Composites Science and Technology, ElSevier, Oct. 9, 2014, 7 pp.

U.S. Appl. No. 15/048,840, by Honeywell International Inc. (Inventors: Jeffrey Rowe et al.), filed Feb. 19, 2016.

U.S. Appl. No. 14/854,993, by Honeywell International Inc. (Inventors: Mark L. La Forest et al.), filed Sep. 15, 2015.

U.S. Appl. No. 14/954,783, by Honeywell International Inc. (Inventors: Mark L. La Forest et al.), filed Nov. 30, 2015.

Office Action from U.S. Appl. No. 14/854,993, dated Aug. 30, 2017, 12 pp.

Black, "3D Printing continuous carbon fiber composites?," Composites World, Gardner Business Media, Inc., May 1, 2014, 8 pp.

Divyashree et al., "Design, Implement and Develop CNT-Metal Composite PCB Wiring Using a Metal 3D Printer," International Journal of Scientific & Engineering Research, vol. 5, No. 5, May 2014, 5 pp.

Krassenstein, "3DXTech's Carbon Nanotube 3D Printer Filament is Here: Exclusive images and details," 3DXTECH, May 13, 2014, 2 pp.

Thryft, "3D Printing High-Strength Carbon Composites Using PEEK, PAEK," Design News, Engineering Materials, Apr. 14, 2014, 5 pp.

"Application of nanoparticles could improve ALM components," technical trends ALM, MPR, Elsevier Ltd., Nov.-Dec. 2012, 3 pp.

"Carbon-fiber filled Nylon—A Material Alternative," Northwest Rapid Manufacturing, Jun. 25, 2012, 3 pp.

"Mark One, the world's first carbon fiber 3D printer now available for pre-order," 3D printer and 3D printing news, www.3ders.org, Feb. 18, 2014, 11 pp.

"Arevo Labs introduces carbon fiber reinforced polymers to 3D print ultra-strong parts," 3D printer and 3D printing news, www.3ders.org, Mar. 24, 2014, 9 pp.

Crandall, "Where Will Additive Manufacturing Take Us?," APICS Magazine, Jan./Feb. 2013, 3 pp.

U.S. Appl. No. 14/711,426, by Honeywell International Inc. (Inventors: Jeffrey Troester et al.), filed May 13, 2015.

U.S. Appl. No. 14/711,508, by Honeywell International Inc. (Inventors: Slawomir T. Fryska et al.), filed May 13, 2015.

U.S. Appl. No. 14/711,550, by Honeywell International Inc. (Inventors: Slawomir T. Fryska et al.), filed May 13, 2015.

U.S. Appl. No. 14/788,217, by Honeywell International Inc. (Inventors: Mark L. La Forest et al.), filed Jun. 30, 2015.

U.S. Appl. No. 62/161,109, by Honeywell International Inc. (Inventors: Jeffrey Rowe et al.), filed May 13, 2015.

Vie et al., "Inkjet printing of 200 nm monodisperse carbon nanoparaticles: from nanoparticles synthesis to smart ink formulation," NSTI-Nanotech, vol. 2, May 2013, pp. 243-246.

Ex Parte Quayle from U.S. Appl. No. 14/854,993, dated Dec. 6, 2017, 5 pp.

Response to Ex Parte Quayle Action dated Dec. 6, 2017, from U.S. Appl. No. 14/854,993, filed Jan. 4, 2018, 5 pp.

Notice of Allowance from U.S. Appl. No. 14/854,993, dated Jan. 26, 2018, 5 pp.

Notice of Allowance from U.S. Appl. No. 14/854,993, dated Apr. 19, 2018, 5 pp.

Examination Report from counterpart European Application No. 16167370.2, dated Mar. 16, 2018, 6 pp.

(56) References Cited

OTHER PUBLICATIONS

Windhorst et al., "Carbon-carbon composites: a summary of recent developments and applications," Materials and Design, vol. 18, Issue 1, 1997, 5 pp. (Applicant points out, in accordance with MPEP 609.04(a), that the year of publication,1997, is sufficiently earlier than the effective U.S. filing date, so that the particular month of publication is not in issue.).

Response to Examination Report dated Mar. 16, 2018, from counterpart European Application No. 16167370.2, filed Jul. 6, 2018, 12 pp.

* cited by examiner

MULTILAYERED CARBON-CARBON COMPOSITE

TECHNICAL FIELD

The disclosure relates to carbon composite materials, e.g., carbon-carbon composite materials used in brake friction materials.

BACKGROUND

Carbon fiber-reinforced carbon materials, also referred to as carbon-carbon composite materials, are composite materials that include carbon fibers reinforced in a matrix of carbon material. The carbon-carbon composite components can be used in many high temperature applications. For example, the aerospace industry employs carbon-carbon composite components as friction materials for commercial and military aircraft, such as brake friction materials.

SUMMARY

Devices, systems, and techniques for forming a carbon-carbon composite component that includes densified layers of carbon fibers are described. In some examples the disclosure describes a method for forming a densified carbon-carbon composite component made up of a plurality of individual densified layers of carbon fibers. The individual densified layers of densified carbon-carbon composite component may be formed on a layer-by-layer basis in that each of the densified layers may be formed by first forming a layer of carbon fibers on a previously formed densified layers and then densifying the layer of carbon fiber, e.g., prior to the addition of another layer of carbon fibers. Each layer of carbon fibers may be densified by depositing a resin on the added layer of carbon fibers and/or applying chemical vapor deposition (CVD) on the added layer of carbon fibers, for example, via a three-dimensional printing system that deposits the resin and/or applies the CVD. The process of forming additional individual densified layers may be repeated until a carbon-carbon composite component having a desired geometry (e.g., thickness) and density is produced form the plurality of individual densified layers of carbon fibers.

In some examples, the disclosure is directed to a method densifying a layer of carbon fibers by at least one of depositing a resin on the layer of carbon fibers via a print head of a three-dimensional printing system or applying CVD on the layer of carbon fibers via the print head; and forming at least one additional layer of densified carbon fibers on the densified layer of carbon fibers, wherein forming the at least one additional layer of densified carbon fibers comprises, for each respective layer of the at least one additional layer, adding an additional layer of carbon fibers on the densified layer of carbon fibers, and densifying the additional layer of carbon fibers by at least one of depositing the resin on the additional layer of carbon fibers or applying CVD on the additional layer of carbon fibers.

In some examples, the disclosure is directed a carbon-carbon composite material comprising a plurality of densified carbon fiber layers, the plurality of densified carbon fiber layers including a first layer of densified carbon fibers densified by at least one of depositing a resin on a first layer of carbon fibers via a print head of a three-dimensional printing system or applying CVD on a first layer of carbon fibers via the print head, and a second layer of densified carbon fibers deposited on the first layer of densified carbon fibers and subsequently densified on first layer of densified carbon fibers by at least one of depositing a resin on a second layer of carbon fibers via the print head or applying CVD on a second layer of carbon fibers via the print head.

In some examples, the disclosure is directed to system comprising a print head configured to at least one of deposit a CVD gas or deposit a resin relative a work surface and a controller configured to control the at least one of depositing the CVD gas or depositing the resin relative the work surface to form a plurality of densified carbon fibers layers, wherein each layer of the plurality of densified carbon fiber layers is formed by the at least one of depositing the resin via the print head on to a layer of carbon fibers or depositing the CVD gas via the print head on to the layer of carbon fibers.

The details of one or more examples are set forth in the accompanying drawings and the description below. Other features, objects, and advantages of the disclosure will be apparent from the description and drawings, and from the claims.

DETAILED DESCRIPTION

Example techniques for forming a densified carbon-carbon composite component are described herein. In some examples, the densified carbon-carbon composite components may be used as a friction material, e.g., as an aircraft brake disc. In the case of an aircraft brake pad, in some examples, the carbon-carbon composite component may take the form of an annular ring, although other shapes may also be used.

Densified carbon-carbon composite components used, for example, in aerospace applications such as brake pads, may be formed from carbon fiber preforms that have been densified using a variety of densification techniques. For example, a carbon fiber preform may be formed by layering fabric sheets formed of woven or nonwoven carbon fiber, which may be then be densified as a whole by chemical vapor infiltration (CVI) or chemical vapor deposition (CVD) to achieve a carbon-carbon composite component exhibiting a desired final density. Such techniques however can be slow and take several applications to achieve the desired final densify. Additionally or alternatively, the preform may be densified by infiltrating the entire preform with liquid resin using, for example, vacuum pressure infiltration (VPI) and/ or resin transfer molding (RTM) followed by carbonization of the resin. Such techniques may be faster than CVI/CVD but can result in a non-uniform density gradient throughout the carbon-carbon composite component that may need further processing to obtain the desired density.

In accordance with one or more examples of the disclosure, a carbon-carbon composite component may be include of a plurality of individual densified layers of carbon fibers. The individual densified layers of densified carbon-carbon composite component may be formed on a layer-by-layer basis in that each of the densified layers may be formed by first forming a layer of carbon fibers on a previously formed densified layers and then densifying the layer of carbon fiber, e.g., prior to the addition of another layer of carbon fibers. Each layer of carbon fibers may be densified by depositing a resin on the added layer of carbon fibers and/or applying chemical vapor deposition (CVD) on the added layer of carbon fibers, for example, via a three-dimensional printing system that deposits the resin and/or applies the CVD. The process of forming additional individual densified layers may be repeated until a carbon-carbon composite component having a desired thickness and density is produced form the plurality of individual densified layers of carbon fibers.

Examples of the disclosure may provide for one or more advantages. For example, reduced cost of manufacturing of materials by limiting excess carbon fibers and carbon matrix material as well as increased or design defined uniformity of the product by densifying a single layer at a time. This could impact wear and stopping performance as well as deter oxidation of the material if designed in such a manner.

Figure 1:
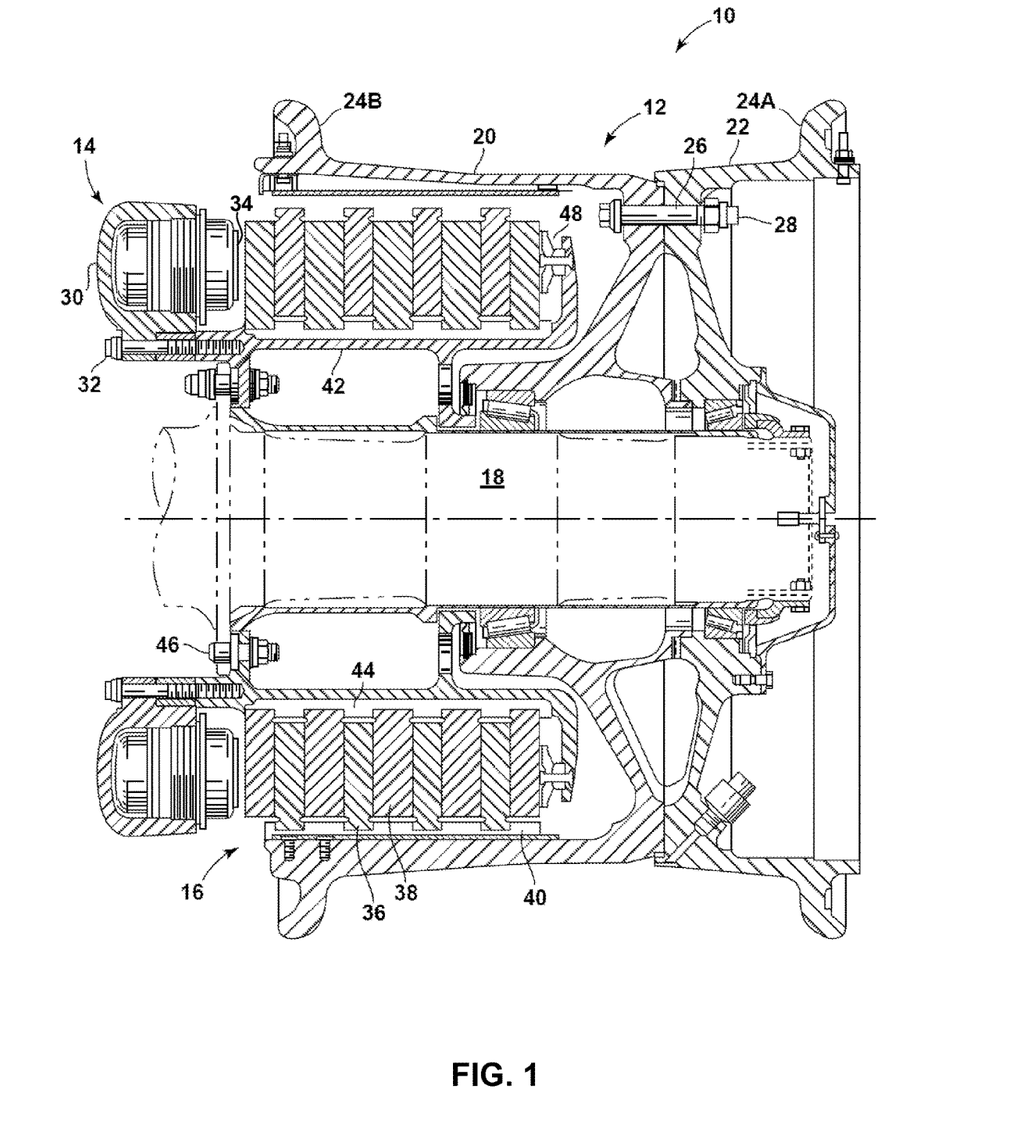
FIG. 1 is a schematic block diagram illustrating an example aircraft brake assembly.

FIG. 1 is a conceptual diagram illustrating an example assembly 10 that may include one or more carbon-carbon composite component components formed in accordance with the techniques of this disclosure. For ease of description, examples of the disclosure will be described primarily with regard to aircraft brake discs formed of carbon-carbon composite components. However, the techniques of this disclosure may be used to form carbon-carbon composite components other than aircraft brake discs. For example, the carbon-carbon composite components may be used as friction materials in other types of braking applications, as well as in other applications such as, e.g., heat exchangers and heat shields.

In the example of FIG. 1, aircraft brake assembly 10 includes wheel 12, actuator assembly 14, brake stack 16, and axle 18. Wheel 12 includes wheel hub 20, wheel outrigger flange 22, bead seats 24A and 24B, lug bolt 26, and lug nut 28. Actuator assembly 14 includes actuator housing 30, actuator housing bolt 32, and ram 34. Brake stack 16 includes alternating rotor discs 36 and stator discs 38; rotor discs 36 are configured to move relative to stator discs 38. Rotor discs 36 are mounted to wheel 12, and in particular wheel hub 20, by beam keys 40. Stator discs 38 are mounted to axle 18, and in particular torque tube 42, by splines 44. Wheel assembly 10 may support any variety of private, commercial, or military aircraft.

Wheel assembly 10 includes wheel 12, which in the example of FIG. 1 is defined by a wheel hub 20 and a wheel outrigger flange 22. Wheel outrigger flange 22 is mechanically affixed to wheel hub 20 by lug bolts 26 and lug nuts 28. Wheel 12 defines bead seats 24A and 24B. During assembly, an inflatable tire (not shown) may be placed over wheel hub 20 and secured on an opposite side by wheel outrigger flange 22. Thereafter, lug nuts 28 can be tightened on lug bolts 26, and the inflatable tire can be inflated with bead seals 24A and 24B providing a hermetic seal for the inflatable tire.

Wheel assembly 10 may be mounted to an aircraft via torque tube 42 and axle 18. In the example of FIG. 1, torque tube 42 is affixed to axle 18 by a plurality of bolts 46. Torque tube 42 supports actuator assembly 14 and stators 38. Axle 18 may be mounted on a strut of a landing gear (not shown) to connect wheel assembly 10 to an aircraft.

During operation of the aircraft, braking may be necessary from time to time, such as during landing and taxiing. Wheel assembly 10 is configured to provide a braking function to an aircraft via actuator assembly 14 and brake stack 16. Actuator assembly 14 includes actuator housing 30 and ram 34. Actuator assembly 14 may include different types of actuators such as one or more of, e.g., an electrical-mechanical actuator, a hydraulic actuator, a pneumatic actuator, or the like. During operation, ram 34 may extend away from actuator housing 30 to axially compress brake stack 16 against compression point 48 for braking.

Brake stack 16 includes alternating rotor discs 36 and stator discs 38. Rotor discs 36 are mounted to wheel hub 20 for common rotation by beam keys 40. Stator discs 38 are mounted to torque tube 42 by splines 44. In the example of FIG. 1, brake stack 16 includes four rotors and five stators. However, a different number of rotors and/or stators may be included in brake stack 16 in other examples. Further, the relative positions of the rotors and stators may be reverse, e.g., such that rotor discs 36 are mounted to torque tube 42 and stator discs 38 are mounted to wheel hub 20.

Rotor discs 36 and stator discs 38 may provide opposing friction surfaces for braking an aircraft. As kinetic energy of a moving aircraft is transferred into thermal energy in brake stack 16, temperatures may rapidly increase in brake stack 16, e.g., beyond 200 degrees Celsius. With some aircraft, emergency braking (e.g., rejected takeoff) may result in component temperatures in excess of 500 degrees Celsius, and in some cases, even beyond 800 degrees Celsius. As such, rotor discs 36 and stator discs 38 that form brake stack 16 may include robust, thermally stable materials capable of operating at such temperatures.

Figure 2:
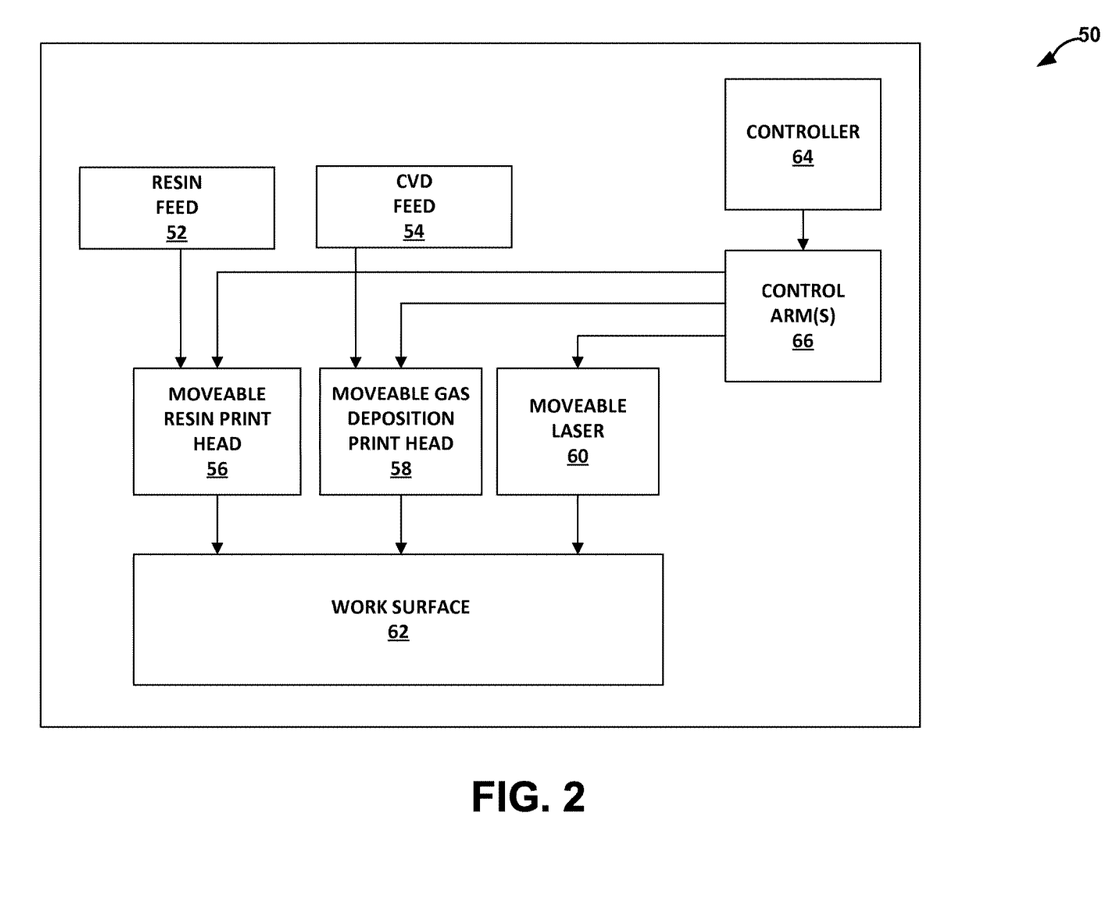
FIG. 2 is a schematic diagram illustrating an example additive manufacturing system which may be used to manufacture an example carbon-carbon composite component.

In one example, rotor discs 36 and/or stator discs 38 are formed of a carbon-carbon composite component fabricated according to one or more example techniques of this disclosure (e.g., the technique described with respect to FIG. 2). In particular, at least one of rotor discs 36 and/or at least one of stator discs 38 may be formed from carbon-carbon composite component produced via one or more of the example techniques of this disclosure. Rotor discs 36 and stator discs 38 may be formed of the same materials or different materials. For example, wheel assembly 10 may include metal rotor discs 36 and carbon-carbon composite stator discs 38, or vice versa. Further, each disc of the rotor discs 36 and/or each disc of the stator discs 38 may be formed of the same materials or at least one disc of rotor discs 36 and/or stator discs 38 may be formed of a different material than at least one other disc of the rotor discs 36 and/or stator discs 38.

As briefly noted, in some examples, rotor discs 36 and stator discs 38 may be mounted in wheel assembly 10 by beam keys 40 and splines 44, respectively. In some examples, beam keys 40 may be circumferentially spaced about an inner portion of wheel hub 20. Beam keys 40 may, for example, be shaped with opposing ends (e.g., opposite sides of a rectangular) and may have one end mechanically affixed to an inner portion of wheel hub 20 and an opposite end mechanically affixed to an outer portion of wheel hub 20. Beam keys 40 may be integrally formed with wheel hub 20 or may be separate from and mechanically affixed to wheel hub 20, e.g., to provide a thermal barrier between rotor discs 36 and wheel hub 20. Toward that end, in different examples, wheel assembly 10 may include a heat shield (not shown) that extends out radially and outwardly surrounds brake stack 16, e.g., to limit thermal transfer between brake stack 16 and wheel 12.

In some examples, splines 44 may be circumferentially spaced about an outer portion of torque tube 42. Splines 44 may, for example, be integrally formed with torque tube 42 or may be separate from and mechanically affixed to torque tube 42. In some examples, splines 44 may define lateral grooves in torque tube 42. As such, stator discs 38 may include a plurality of radially inwardly disposed notches configured to be inserted into a spline.

Because beam keys 40 and splines 44 may be in thermal contact with rotor discs 36 and stator discs 38, respectively, beam keys 40 and/or splines 44 may be made of thermally stable materials including, e.g., those materials discussed above with respect to rotor discs 36 and stator discs 38. Accordingly, in some examples, example techniques of the disclosure may be used to form a beam key and/or spline for wheel assembly 10.

The example assembly 10 shown in FIG. 1 is merely one example. In other examples, assembly 10 and the components of assembly 10 (e.g., wheel 10, actuator assembly 14, brake stack 16, and axle 18) may have another suitable configuration. In addition, in other examples, the carbon-carbon composite components described herein resulting from example carbon fiber preforms may be used to form other structures in addition to, or instead of, one or more of discs 36, 38, keys 40, and spline 44.

Figure 6:
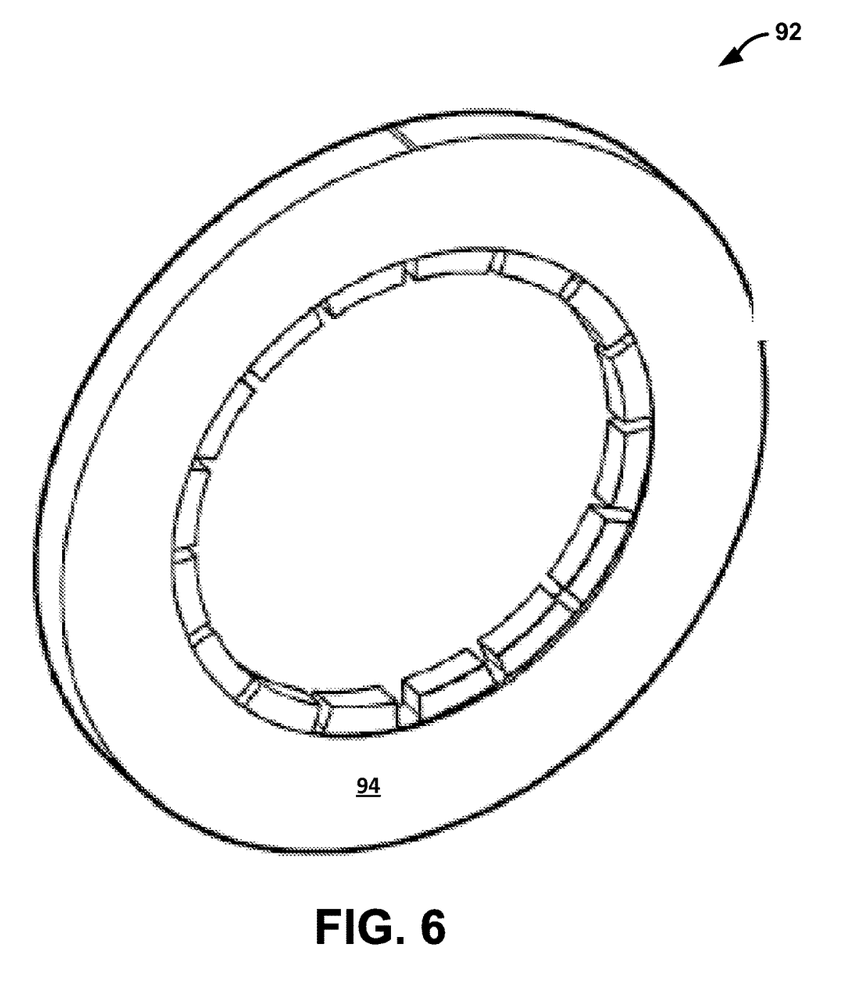
FIG. 6 is a conceptual diagram illustrating an example carbon-carbon composite component.

FIG. 6 is a conceptual diagram illustrating an example carbon-carbon composite component 92 in accordance with aspects of the disclosure. Component 92 may be an example of rotor discs 36 and stator discs 38 of FIG. 1 in the form of an annular ring. Carbon fiber component 92 is formed of densified carbon fiber material 94, and includes a plurality of individual densified carbon fiber layers (not shown in FIG. 2). As described herein, the densified individual layers may be sequentially formed on one another, where the combination of the individual layers defines material 94. However, rather than densifying a fiber preform including a plurality of carbon fibers layers as a whole, for example, the respective layers of densified material 94 may be densified on an individual basis. For example, each individual layer may be formed through of process including forming a layer of carbon fibers, densifying the layer of carbon fiber by depositing a resin on the layer of carbon fibers and/or applying CVD on the layer of carbon fibers. Once the carbon fiber layer has been densified, another layer of carbon fiber may be formed on the densified carbon fiber, and that new layer of carbon fiber may also be densified by depositing a resin on the layer of carbon fibers and/or applying CVD. This process may be repeated until the combination of layers form a densified carbon-carbon composite material, such as, e.g., material 94, exhibiting a desired three-dimensional geometry. As described further herein, densification of a layer of carbon fibers by depositing a resin on the layer of carbon fibers and/or applying CVD on the layer of carbon fibers may be performed via a three-dimensional printing system.

FIG. 2 is a schematic diagram illustrating example three-dimensional printing system 50 that may be used to form densified carbon-carbon composite component 92 via an additive manufacturing process. However, other systems or combinations of systems for forming the densified layers of the carbon-carbon composite component in accordance with examples of the disclosure are contemplated.

As shown, system 60 includes resin feed 52 which feeds resin material used to densify a layer of carbon fiber to moveable resin print head 56. In some examples, the resin material may be in the form of prefabricated pellets or a coiled ring of resin material. Resin feed 52 may then heat the resin material to a temperature that melts the antioxidant material or otherwise softens the resin material in a manner that allows the heated material to flow out of one or more outlets defined by moveable print head 68. For example, resin print head 56 may include a die defining one or more apertures through which the antioxidant material is forced out of during the 3D printing process (e.g., by applying a high pressure). The one or more apertures of the die of resin print head 56 may have a geometry that allows for the printed resin material to have a desired cross-section upon being forced out of resin print head 56, e.g., via an extrusion process.

The resin material flowing out of resin print head 56 may be directed towards work surface 62, e.g., where one or more layers of carbon fibers may be secured during the deposition process. The resin material flowing out of print head 56 may be directed to a desired position on relative the layer of carbon fibers to densify the layer of carbon fiber in the desired manner using the deposited resin material. The deposited resin material may be allowed to cool to form a solid layer of the carbon fibers embedded in the deposited resin material. The resin material may be deposited via resin print head 56 on a continuous or discontinuous basis during the printing process, and the position of the resin print head 56 in the three-dimensional space relative a carbon fiber layer on work surface 62 may be adjust on a continuous or discontinuous basis.

As shown in FIG. 2, system 50 also a CVD feed 54 which supplies a gas suitable for CVD of a layer of carbon fibers to movable gas deposition print head 58. The gas from CVD feed 54 flows out of one or more outlets defined by moveable gas deposition print head 68, and may be directed towards one or more layer of carbon fibers secured on work surface 62. In some examples, the gas for CVD feed 54 can be stored in a pressurized tank (not shown) or delivered through normal gas delivery methods for large volume applications such as through Utility Systems. The gas for CVD feed 54 may be delivered through a nozzle in movable gas deposition print head 68 that can control flow and direction of the CVD gas as specified during the product design.

In addition, system 50 also includes moveable laser 60. Laser head 60 may be configured to heat, e.g., a resin deposited on a layer of carbon fibers by resin print head 56 to an elevated temperature. For example, the resin may be heated via layer head 60 to induce, for example, partial polymerization/crosslinking of the resin within the layer of the carbon fibers. In another example, laser head 60 may be configured to heat the resin to a sufficiently high temperature to cause the resin to undergo carbonization. In some examples, the resin may be deposited and carbonized using the same printing system 50 and may be done prior to the addition of another layer of the carbon fibers. Additionally or alternatively, the resin may be carbonized after substantially all the layers of densified carbon fiber material have been formed. For example, in some examples, induction heating methods may be applied to the layers with deposited resin to convert the resin into a cured or carbonized state. For example, the layer with deposited resin may be formed on work surface 62 which may be heated to a design specified and controlled temperature. The elevated temperature of work surface 62 may then cause the resin to cures or covert into a desired state.

In the example illustrated in FIG. 2, system 50 includes controller 64, which may control operation of system 50 during the process of depositing a resin on a layer of carbon fibers via resin print head 56 and/or applying a gas to a layer of carbon fibers via gas deposition print head 58. For example, during the densification process, controller 64 may control the movement of control arm(s) 66. Control arm(s) 66 may include one or more arms attached to moveable resin print head 66, gas deposition print head 58, and/or laser 60. For example, control arm(s) may include three separate control arms attached to moveable resin print head 66, gas deposition print head 58, and laser 60, respectively. In other examples, an individual control arm may be attached to multiple ones of moveable resin print head 66, gas deposition print head 58, and laser 60. By moving control arm(s) 66, controller 64 may control the position of moveable resin print head 66, gas deposition print head 58, and laser 60 relative a layer carbon fibers secured on work surface 66.

One or more of moveable resin print head 66, gas deposition print head 58, and laser 60 may be moveable in each of the x, y, and z-directions. In this manner, controller 70 may control the position of moveable resin print head 66, gas deposition print head 58, and/or laser 60 relative to a carbon fiber layer on work surface 62 such that resin deposited via resin print head 56, gas flowing out of gas deposition print head 58, and focus of laser from laser 60 densifies the layer of carbon fibers in the desired manner. Additionally or alternatively, controller 70 may control the position of resin print head 66, gas deposition print head 58, and/or laser 60 relative work surface 66 by moving work surface 66 rather than keeping it stationary during the densification process. In some examples, stepper motors, servo motors, or other suitable devices may be employed to move resin print head 66, gas deposition print head 58, and/or laser 60. Controller 64 may adjust the temperature, pressure, and/or flow rate of the resin and gas flowing out of resin print head 66 and gas deposition print head 58, respectively, and adjust the position and intensity of laser 60 to provide for the desired densification of a layer of carbon fibers. Additionally, controller 64 may control one or more other factors of the densification process, such as, e.g., flow direction and environmental conditions of the surrounding work area.

In some examples, controller 64 may include a microprocessor or multiple microprocessors capable of executing and/or outputting command signals in response to received and/or stored data. Controller 64 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. Controller 64 may include computer-readable storage, such as read-only memories (ROM), random-access memories (RAM), and/or flash memories, or any other components for running an application and processing data for controlling operations associated with system 50. Thus, in some examples, controller 64 may include instructions and/or data stored as hardware, software, and/or firmware within the one or more memories, storage devices, and/or microprocessors. In some example, controller 64 may control system 50 using a computer-aided manufacturing (CAM) software package running on a microcontroller. Controller 64 may include multiple controllers or only a single controller.

While system 50 includes configurations for both the resin deposition and CVD application onto work surface 62, other configurations are also contemplated in accordance with the disclosure. For example, depending on techniques applied, the liquid resin and CVD gas may be applied using the same or different print heads or the same or different printer systems. In some examples, the densified layers carbon fibers may be formed using just the techniques involving depositing resin or just the techniques involving applying CVD. In such examples printer system 50 may be configured to accomplish just the desired densification technique.

In some examples, printing system 50 may be configured to also form the layers of the carbon fibers prior to being densified by depositing the resin or applying CVD. In this way, the densified layers may be formed by first depositing a carbon fiber material on work surface 62 via a print head on the three-dimensional printer system 50 (not shown in FIG. 2.). The carbon fiber materiel may be deposited either directly on work surface 62, e.g., forming a first layer of carbon fibers, or indirectly on work surface 62, e.g., where the deposited carbon fibers for densification are formed on previously densified layers of carbon fibers.

Alternatively, in some examples the layers of the carbon fibers may be prefabricated. For example, the layers of carbon fibers may be in the form of a fabric sheet formed of woven or nonwoven carbon fibers or include a carbon fiber precursor, such as polyacrylonitrile (PAN) or rayon, which may be converted into carbon fiber thorough a carbonization process. In some examples, a single layer of carbon fibers may have a thickness of about 0.125 inches. Depending of the intended application for the final product, the layer of carbon fibers may be cut to a specific shape including, for example, a disc brake having a desired internal diameter and outer diameter, or other structural features for attachment purposes. A single layer of carbon fibers may have a fiber volume density of about 900 to about 1000 g of fibers per square meter. The fibers may be continuous or segmented depending on design specifics of the product. After a layer of the carbon fibers is added to work surface 62, the layer may be densified by depositing the resin print head 56 and/or applying CVD via print head 58.

Figure 3:
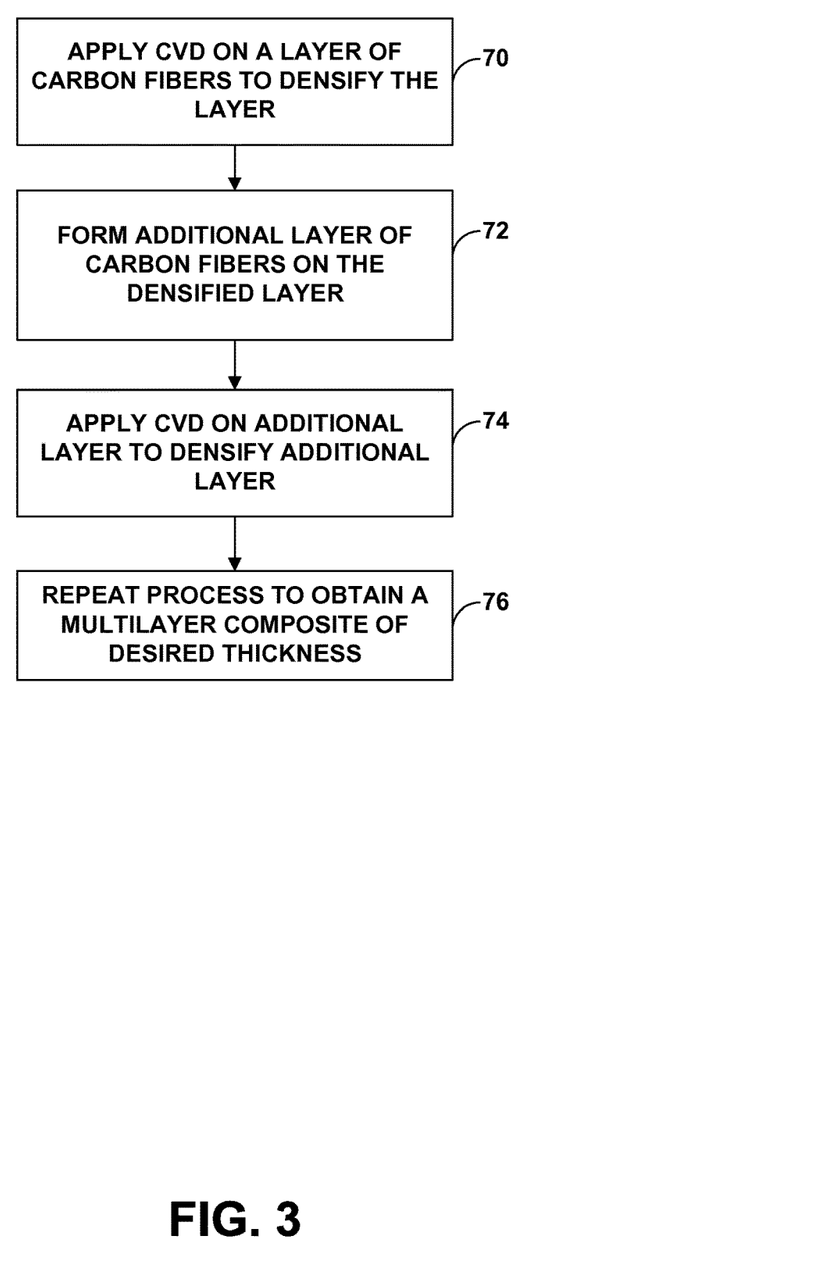
FIG. 3 is a flow diagram illustrating an example technique for forming a carbon-carbon composite component by applying chemical vapor deposition on layers of carbon fibers in accordance with aspects of this disclosure.

FIG. 3 is a flow diagram illustrating an example technique of forming a carbon-carbon composite by applying CVD to layers of carbon fibers in accordance with aspects of the disclosure. For ease of illustration, the example of FIG. 3 is described as being performed via print system 50 of FIG. 2; however, other systems suitable for carrying out the additive manufacturing to form the carbon-carbon composite are contemplated.

As shown, controller 64 may control the operation of CVD gas feed 54 and deposition print head 58 to apply a carbonaceous gas onto and around an individual layer of carbon fibers that is positioned on work surface 62 in a manner that densifies the layer of carbon fibers (70). Throughout the process, controller 64 may control the position of print head 58 via control arm 66 such that substantially all or a portion of layer of carbon fibers is densified. In some example, the application of the gas to the carbon fibers may take place in a furnace of other heated environment, e.g., to promote the chemical vapor deposition process.

After the layer is densified, an additional layer of carbon fibers can be formed on the previously formed densified layers (72). The newly added layer of carbon fibers, as discussed prior, may be prefabricated and attached to the densified layers by, for example, depositing the newly added layer of carbon fibers in combination with a resin to secure the newly added layer of carbon fibers to the densified layers.

In other examples system 50 can include a carbon composite material feed so that the additional layer of carbon fibers is formed on the densified layers via the three-dimensional printing system 50. By forming the additional layer of carbon fibers (72) directly with the three-dimensional printing system 50, z-axis fibers (e.g., fibers extending orthogonally from work surface 62), may be formed connecting the densified layers of carbon fibers which can provide increased strength of the perform, thereby reducing the chance of the layers delaminating.

In some examples, each newly added layer of carbon fibers (72) may be substantially planar, e.g. planar or nearly planer. In other examples the added layers of carbon fibers (72) may be non-planer, e.g., rippled or corrugated layers of carbon fibers. The non-planar layers of carbon fibers may provide added resistance against layer delamination, particularly when the additional layer of carbon fibers includes a prefabricated sheet as discussed above.

Either during or after the additional layer of carbon fibers is formed (72), CVD feed 54 can be reengaged to apply the carbonaceous gas onto the additional layer of carbon fibers in a manner that densifies the additional layer of carbon fibers (74). Again, controller 64 may control the position of print head 58 in three-dimensions, throughout the application process. Depending on the intended purpose for the densified carbon-carbon composite component, the final density of the component may include densities of about 1.5 to about 2.0 g/cc.

The entire process can be repeated until a multilayered carbon-carbon composite component having a desired thickness is produced (76). For example, a carbon-carbon composite component that is to be used as an aircraft disc brake may include between about 15 and about 30 total layers with an overall thickness of about 0.75 inches to about 1.25 inches. In some examples, applying CVD to the relatively thin layer of carbon fibers may reduce operation times, for example, in comparison to applying one or more cycles of CVI/CVD to a fully formed carbon fiber preform.

In some examples, the application of the carbonaceous gas to densify a layer of carbon fibers via CVD (70) may occur substantially in a vacuum space (e.g., printer system 50 is placed in a vessel at less than 100 Torr) or under an inter gas environment so as to control the chemical deposition reaction. In some examples, during application of the CVD gas, the environment may be heated to an elevated temperature, for example between about 900° C. and about 1200° C., to promote the chemical deposition reaction. During the densification, when the carbonaceous gas gets deposited via print head 58 onto a layer of the carbon fibers, a complex set of dehydrogenation, condensation, and polymerization reactions may occur to deposit the carbon atoms within the layer of carbon fibers, which, over time, will densify (increase the density) the layer of carbon fibers. In another example, the position where print head 58 deposits CVD gas on the layer of carbon fibers may be heated to an elevated temperature by, for example, a heating element in the gas deposition print head 58 and/or an optional moveable laser 60 directed at the site of application on work surface 62.

Any suitable carbonaceous gas may be used during the CVD application including, for example, carbon-based gases such as natural gas, methane, ethane, propane, butane, propylene, or acetylene, or a combination of at least two of these gases. U.S. Patent Application Publication No. 2006/0046059 (Arico et al.), the entire disclosure of which is incorporated herein by reference, provides an overview of example CVD/CVI processing that can be used with the techniques described herein.

As noted above, once a carbon fiber layer is densified by applying CVD (70), the process can be repeated by adding an additional layer of the carbon fibers to the previously densified layer and applying CVD and/or depositing the resin to the newly added layer of the carbon fibers (76). This process may be repeated until a carbon-carbon composite component having a desired three-dimensional geometry, thickness, and/or density is produced, such as, e.g., a component in the form of a carbon brake disc. In some examples, the carbon-carbon composite component can be fabricated so that it is sufficiently large so that it can be cut into multiple devices, e.g., multiple disc brakes, at a later time. As will be described further below, in some examples, the process may include a combination of CVD and resin densification, e.g., using CVD to densify some individual carbon fiber layers while using resin densification for other individual carbon fiber layers. Additionally or alternatively, a combination of CVD and resin densification may be used to densify the same layer of carbon fibers.

Figure 4:
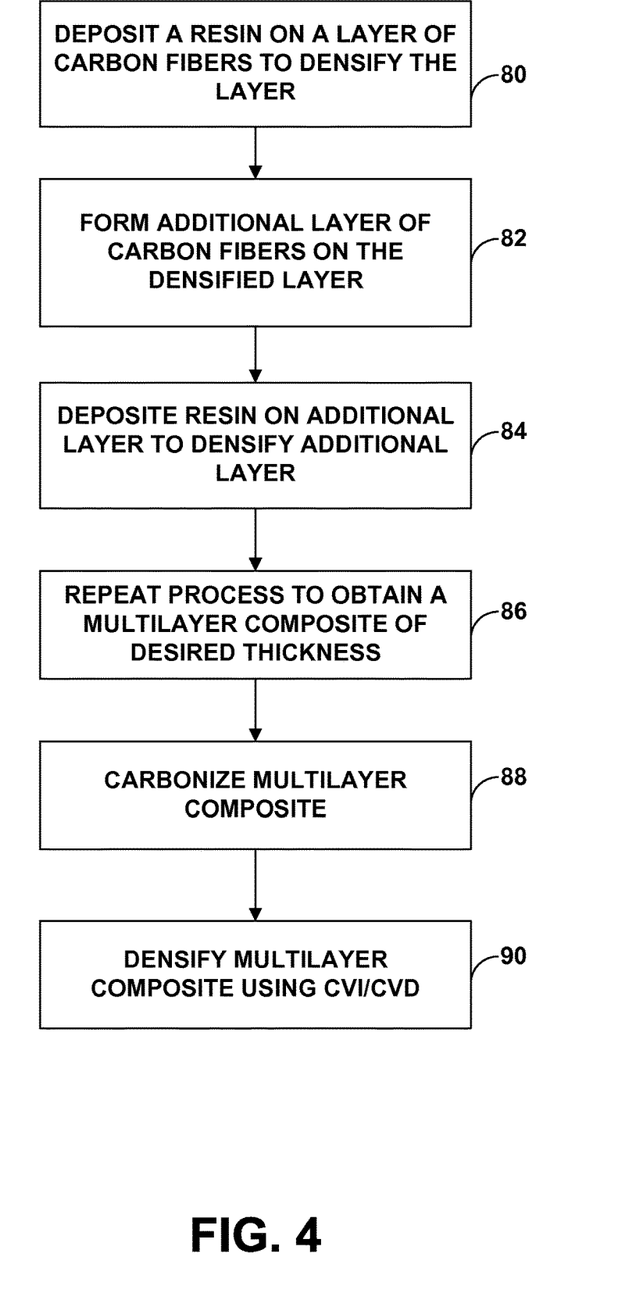
FIG. 4 is a flow diagram illustrating an example technique for forming a carbon-carbon composite component by depositing a resin on layers of carbon fibers in accordance with aspects of this disclosure.

FIG. 4 is another flow diagram illustrating an example technique of forming a carbon-carbon composite that involves densifying layers of carbon fibers by deposing a resin in accordance with aspects of the disclosure. Similarly, for ease of illustration, the example of FIG. 4 is described as being performed via system 50 of FIG. 2.

As shown, controller 64 may control resin feed 52 and resin print head 56 to deposit a resin via print head 56 on a layer of carbon fibers on work surface 62 in a manner that densifies the carbon fiber layer (80). The resin may be in liquid form under ambient conditions or resin feed 52 may heat the resin above its melting point to facilitate deposition of the resin on to work surface 62. Throughout the process, controller 64 may control the position of print head 56 and flow of resin such that substantially all or a portion of the layer of carbon fibers is densified in the manner desired. Once the layer of carbon fibers is densified by the deposited resin, an additional layer of carbon fibers can be formed on the previously the densified layer (82). Controller 64 may again control resin feed 52 and resin print head 56 to deposit a resin via print head 56 onto the newly formed layer of carbon fibers in a manner that densifies the new additional carbon fiber layer (84). This process may be repeated multiple times until a multilayered carbon-carbon composite component having a desired three-dimensional thickness is produced (86). In some examples, applying the resin on a layer by layer basis may allow the resin to infiltrate the layers of carbon fibers without the need to apply vacuum pressure infiltration (VPI) and/or resin transfer molding (RTM).

As described above, in some examples, once the multi-layered carbon-carbon composite component is formed, the component can heated such that the resin undergoes carbonization (88). Once carbonized, the carbon-carbon composite component may, in some examples, be subjected to one or more cycles of CVI/CVD to increase the density of the component (90). e.g., beyond those densities achievable via resin densification alone.

Any suitable resin material may be used to make the densified layers of carbon fiber material, including for example, synthetic, coal tar, petroleum isotropic and mesophase pitch, phenolic resin, epoxy resin, or the like. In some examples the resin may be a carbonizable resin material (e.g., pitch) such that carbon is formed from the resin during a carbonization process.

In some examples, the resin may include pitch that is s hydrocarbon-rich material that may be extracted, e.g., from coal, tar, and petroleum. In some examples, the pitch may also be synthetically produced. In another example, the pitch may come from a single source (e.g., coal) or may be a combination of different pitches from different sources. In some examples, the pitch may be a mesophase pitch. In other examples, the pitch may be an isotropic pitch. Combinations of mesophase and isotropic pitches are also contemplated within the scope of the disclosure.

As noted above, in some examples, the resin may be available in liquid form under ambient conditions, while in other examples the resin may a solid or semisolid under ambient conditions and may be converted to a liquid form by heating. In such cases, resin feed 52 may be configured to melt the resin, if necessary, prior to delivering the resin through print head 56.

In some examples, the composition of the resin may be selected to exhibit a melting point below approximately 150 degrees Celsius, a polymerization/crosslinking temperature between approximately 180 degrees Celsius and approximately 270 degrees Celsius, and/or carbonization temperature above approximately 450 degrees Celsius.

Once the resin is deposited on the layer of the carbon fibers (80), in some examples, the resin may be stabilized or partially solidified prior to adding another layer of carbon fibers (82). In some examples, the resin may be stabilized or partially solidified under ambient conditions while in other examples, the resin may be stabilized or partially solidified by heating the resin using, for example, an optional moveable laser head 60 attached to printing system 50. Laser head 60 may be configured to heat the resin to an elevated temperature to induce, for example, partial polymerization/crosslinking of the resin within the layer of the carbon fibers. In another example, laser head 60 may be configured to heat the resin to a sufficiently high temperature to cause the resin to undergo carbonization. In some examples, the resin may be deposited and carbonized using the same printing system 50 and may be done prior to the addition of another layer of the carbon fibers. Additionally or alternatively, the resin may be carbonized after substantially all the layers of densified carbon fiber material have been formed.

Once the layer is densified by depositing the resin, the process can be repeated by adding an additional layer of the carbon fibers to the previously densified layers and depositing more resin and/or applying CVD to the additional layer of the carbon fibers. This process may be repeated until a carbon-carbon composite component having a desired three-dimensional geometry, thickness, and/or density is produced, such as, e.g., a carbon brake disc. In some examples, the carbon-carbon composite component can be fabricated so that it is sufficiently large and can be cut into multiple devices, e.g., multiple disc brakes, at a later time.

In some examples, after the resin has been deposited and carbonized, the deified layers of the carbon-carbon composite component may be further densified by applying CVD/CVI to fill voids in the component that may result from gas evolution during the crosslinking and carbonization processes of the resin. This process may occur on a layer by layer basis or may be done after substantially all the densified layers have been formed. For example, printing system 50 may deposit the resin via print head 56 on a layer of carbon fibers and then carbonize the resin by heating with laser 60. After the resin carbonization has occurred, CVD feed 54 may be engaged to deposit a carbonaceous gas via gas deposition print head 58 on the newly formed densified layer of carbon fibers by utilizing, for example, one or more of the techniques discussed prior to obtain a desired layer density, for example, between approximately 1.75 grams per cubic centimeter (g/cc) and approximately 1.90 g/cc. After applying CVD to the densified layer, an additional layer of carbon fibers may be added and the process can be repeated.

In another example, the carbon-carbon composite component may be substantially formed by the resin deposition technique disclosed above. Then, the carbon-carbon composite component may be carbonized followed by the application of one or more cycles of CVI/CVD to obtain a desired density.

Figure 5:
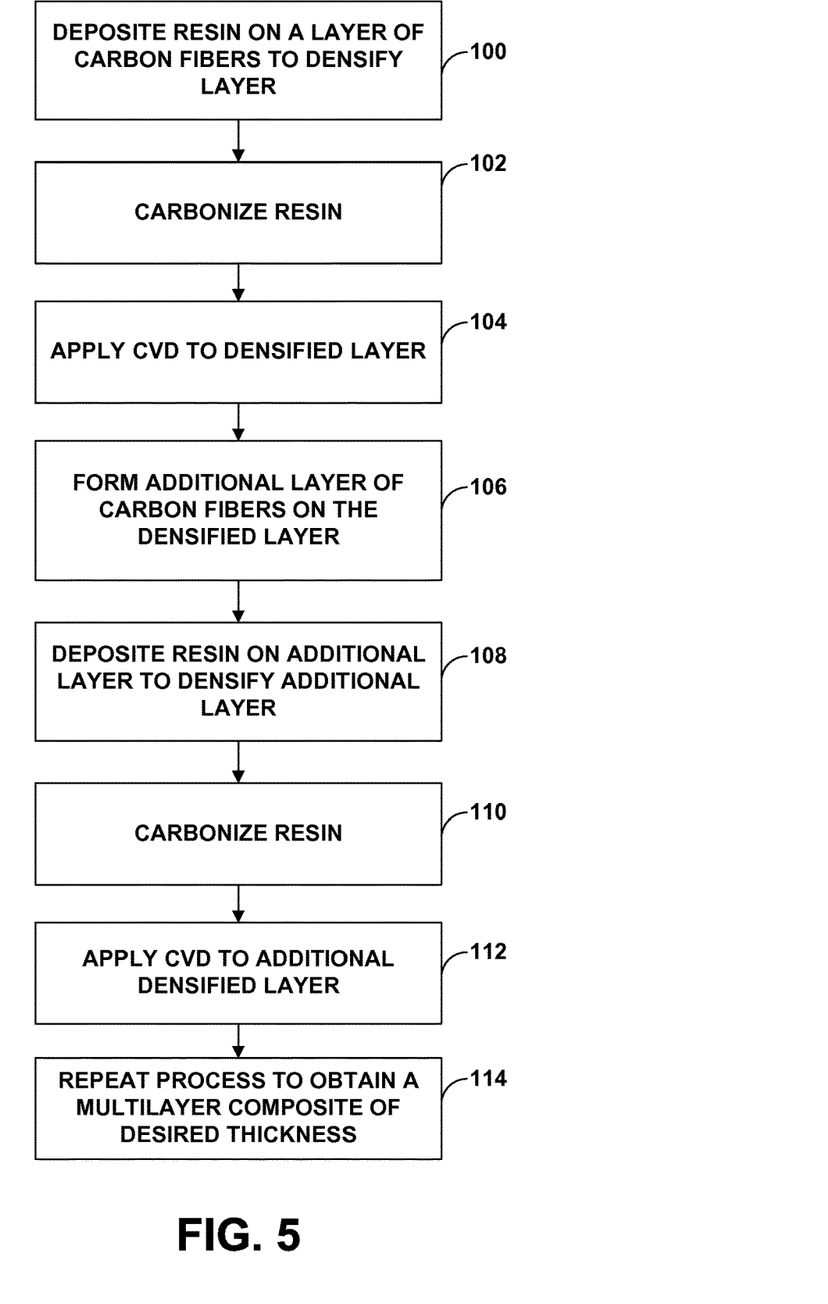
FIG. 5 is a flow diagram illustrating an example technique for forming a carbon-carbon composite component by depositing a resin and applying chemical vapor deposition on layers of carbon fibers in accordance with aspects of this disclosure.

Another example technique is illustrated in the flow diagram of FIG. 5, which involves densifying layers of carbon fibers by both deposing a resin and applying CVD. In a similar fashion, the example of FIG. 5 is described as being performed via system 50 for ease of illustrating.

As shown in FIG. 5, controller 64 may control resin feed 52 and resin print head 56 to deposit a resin via print head 56 on a layer of carbon fibers on work surface 62 to densify the carbon fiber layer (100)(e.g., similar to that of step 80 in FIG. 4). The densified layer of carbon fibers can then be heated to carbonize the resin (102), for example, via the use of movable laser head 60 operated and controlled via controller 64 and control arm 66. After the resin is carbonized (102), controller 64 may control CVD gas feed 54 and print head 58 to deposit a carbonaceous gas onto the densified layer of carbon fibers in a manner that increases the density of the densified layer (104) (e.g., similar to that of step 70 of FIG. 3), for example, to a target density of approximately 1.7 grams per cubic centimeter or more.

An additional layer of carbon fibers may be subsequently formed on the densified layer using, for example, the techniques described above (106). Controller 64 may control resin feed 52 and resin print head 56 to deposit the resin onto the newly formed layer of carbon fibers to create an additional densified layer of carbon fibers (108). The newly deposited resin can then be carbonized (110) followed by a subsequent application of CVD (112). Process steps (108) to (112) can be repeated until a multilayered carbon-carbon composite component having a desired three-dimensional thickness is produced (114).

Examples of different techniques for forming carbon-carbon composite materials have been described. In different examples, techniques of the disclosure may be implemented in different hardware, software, firmware or any combination thereof. In some examples, techniques of the disclosure may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. In some examples, techniques of the disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD- ROM, a floppy disk, a cassette, magnetic media, optical media, or other computer readable media.

Various examples have been described. These and other examples are within the scope of the following claims.

What is claimed is:

1. A method comprising:
   densifying a layer of carbon fibers using a print head of a three-dimensional printing system to apply a carbonaceous gas using chemical vapor deposition (CVD) on the layer of carbon fibers, wherein the print head is maneuvered in three-dimensional space relative to the layer of carbon fibers to apply the carbonaceous gas to the layer of carbon fibers; and
   forming at least one additional layer of densified carbon fibers on the densified layer of carbon fibers, wherein forming the at least one additional layer of densified carbon fibers comprises, for each respective layer of the at least one additional layer:
   adding an additional layer of carbon fibers on the densified layer of carbon fibers, and
   densifying the additional layer of carbon fibers by at least one of depositing a molten resin on the additional layer of carbon fibers or applying the carbonaceous gas using CVD on the additional layer of carbon fibers.

2. The method of claim 1, wherein the carbonaceous gas comprises at least one of natural gas, methane, ethane, propane, butane, propylene, or acetylene.

3. The method of claim 1, wherein adding the additional layer of the carbon fibers on the densified layer of carbon fibers comprises depositing a pre-fabricated fabric layer of carbon fibers on the densified layer of carbon fibers.

4. The method of claim 1, wherein densifying the additional layer of carbon fibers comprises depositing the molten resin on the additional layer of carbon fibers, the method further comprising, carbonizing the molten resin after depositing the molten resin on the additional layer of carbon fibers and before forming at least one of the additional layer of densified carbon fibers.

5. The method of claim 1, wherein densifying the additional layer of carbon fibers comprises densifying the additional layer of the carbon fibers by depositing the molten resin on the additional layer of carbon fibers and applying the carbonaceous gas using CVD on the additional layer of carbon fibers.

6. The method of claim 1, wherein after densifying the layer of carbon fibers using the print head to apply the carbonaceous gas, the layer of carbon fibers exhibits a density greater than approximately 1.7 grams per cubic centimeter.

7. The method of claim 1, wherein the step of forming at least one additional layer of densified carbon fibers is repeated until at least approximately 15 layers of densified carbon fibers are formed.

8. The method claim 1, wherein the layer of carbon fibers forms a rippled or a corrugated layer of carbon fibers.

9. A method comprising:
   densifying a layer of carbon fibers by depositing a first molten resin on the layer of carbon fibers using a print head of a three-dimensional printing system, wherein the print head is maneuvered in three-dimensional space relative to the layer of carbon fibers to apply the first molten resin;
   carbonizing the first molten resin after depositing the first molten resin on the layer of carbon fibers to form a carbonized layer;
   after carbonizing the first molten resin, using a second print head of the three-dimensional printing system to apply a carbonaceous gas using chemical vapor deposition (CVD) on the carbonized layer, wherein the second print head is maneuvered in three-dimensional space relative to the carbonized layer to apply the carbonaceous gas; and
   after applying the carbonaceous gas on the carbonized layer, forming at least one additional layer of densified carbon fibers on the carbonized layer, wherein forming the at least one additional layer of densified carbon fibers comprises, for each respective layer of the at least one additional layer:
   adding an additional layer of carbon fibers on the carbonized layer, and
   densifying the additional layer of carbon fibers by at least one of depositing a second molten resin on the additional layer of carbon fibers or applying the carbonaceous gas using CVD on the additional layer of carbon fibers.

10. The method of claim 9, wherein the carbonaceous gas comprises at least one of natural gas, methane, ethane, propane, butane, propylene, or acetylene.

11. The method of claim 9, wherein adding the additional layer of the carbon fibers on the carbonized layer comprises depositing a pre-fabricated fabric layer of carbon fibers on the carbonized layer.

12. The method claim 9, wherein the carbonized layer forms a rippled or a corrugated layer, and wherein adding the additional layer of carbon fibers on the carbonized layer comprises depositing the additional layer of carbon fibers on the rippled or corrugated layer.

13. The method of claim 9, wherein densifying the additional layer of carbon fibers comprises depositing the second molten resin on the additional layer of carbon fibers, the method further comprising, carbonizing the second molten resin after depositing the second molten resin on the additional layer of carbon fibers and before forming at least one of the additional layer of densified carbon fibers.

14. The method of claim 9, wherein carbonizing the first molten resin comprises using laser coupled to three-dimensional printing system, wherein the laser is maneuvered by the three-dimensional printing system in three-dimensional space relative to the layer of carbon fibers to carbonize the first molten resin.

15. The method of claim 9, wherein densifying the additional layer of carbon fibers comprises densifying the additional layer of the carbon fibers by depositing the second molten resin on the carbonized layer and applying the carbonaceous gas using CVD on the additional layer of carbon fibers.

16. The method of claim 9, wherein the step of forming at least one additional layer of densified carbon fibers is repeated until at least approximately 15 layers of densified carbon fibers are formed.

* * * * *